(12) United States Patent
Xie et al.

(10) Patent No.: US 12,660,260 B2
(45) Date of Patent: Jun. 16, 2026

(54) REDUCING CHANNEL STRUCTURE TIP DAMAGE DURING SPACER DEPOSITION

(71) Applicant: International Business Machines Corporation, Armonk, NY (US)

(72) Inventors: Ruilong Xie, Niskayuna, NY (US); Hemanth Jagannathan, Niskayuna, NY (US); Oleg Gluschenkov, Tannersville, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 17/673,775

(22) Filed: Feb. 16, 2022

(65) Prior Publication Data

US 2023/0261049 A1     Aug. 17, 2023

(51) Int. Cl.
| | |
|---|---|
| *H10D 62/10* | (2025.01) |
| *H10D 30/01* | (2025.01) |
| *H10D 30/63* | (2025.01) |
| *H10D 30/67* | (2025.01) |

(52) U.S. Cl.
CPC ......... H10D 62/118 (2025.01); H10D 30/025 (2025.01); H10D 30/63 (2025.01); H10D 30/6735 (2025.01); H10D 30/6757 (2025.01)

(58) Field of Classification Search
CPC .... H10D 62/118; H10D 30/025; H10D 30/63; H10D 30/6735; H10D 30/6757; H10D 30/43; H10D 64/017; H10D 30/014; H10D 30/751; H10D 62/121; B82Y 10/00

USPC ........................................................ 257/329
See application file for complete search history.

(56) References Cited

U.S. PATENT DOCUMENTS

| | | | | |
|---|---|---|---|---|
| 9,601,342 B2 * | 3/2017 | Lee | ..................... | H10D 30/4755 |
| 9,929,246 B1 | 3/2018 | Cheng | | |
| 9,941,378 B2 | 4/2018 | Basker | | |
| 10,109,742 B2 * | 10/2018 | Chao | .................... | H10D 62/292 |
| 10,199,464 B2 | 2/2019 | Cheng | | |
| 10,325,820 B1 | 6/2019 | Seo | | |
| 10,332,961 B2 | 6/2019 | Cheng | | |
| 10,546,858 B2 | 1/2020 | Kavalieros | | |
| 10,790,379 B1 * | 9/2020 | Li | ......................... | H10D 30/63 |
| 11,094,826 B2 * | 8/2021 | More | ................... | H10D 30/751 |
| 11,158,726 B2 * | 10/2021 | Su | ........................ | H10D 84/038 |
| 11,424,347 B2 * | 8/2022 | Liao | ................... | H10D 84/0186 |
| 11,430,893 B2 * | 8/2022 | Shen | ................... | H10D 30/024 |
| 12,211,938 B2 * | 1/2025 | More | ................ | H10D 30/6219 |
| 2013/0221448 A1 * | 8/2013 | Chang | .................. | H10D 30/024 |
| | | | | 438/701 |
| 2015/0228775 A1 * | 8/2015 | Yu | ........................ | H10D 30/014 |
| | | | | 257/329 |
| 2018/0204951 A1 | 7/2018 | Cheng | | |
| 2018/0240873 A1 * | 8/2018 | Cheng | .................. | H10D 30/025 |
| 2018/0247938 A1 * | 8/2018 | Cheng | .................. | H10D 84/853 |
| 2018/0286982 A1 * | 10/2018 | Krishnan | ............. | H10D 62/151 |
| 2019/0081155 A1 | 3/2019 | Xie | | |

(Continued)

FOREIGN PATENT DOCUMENTS

| | | |
|---|---|---|
| CN | 103928349 B | 3/2017 |

*Primary Examiner* — Mohammad M Hoque
(74) *Attorney, Agent, or Firm* — Seed Intellectual Property Law Group LLP

(57) ABSTRACT

A semiconductor structure includes a semiconductor channel structure that has a body and a tip and a dielectric spacer adjacent to the tip. The tip is no less than 70% the thickness of the body.

14 Claims, 8 Drawing Sheets

(56) References Cited

U.S. PATENT DOCUMENTS

| | | | | | |
|---|---|---|---|---|---|
| 2019/0164819 | A1* | 5/2019 | Chou | .................. | H10P 14/6529 |
| 2021/0020523 | A1* | 1/2021 | Jeon | .................... | H01L 21/3086 |
| 2021/0066477 | A1* | 3/2021 | Lee | .................... | H10D 84/0158 |
| 2021/0184045 | A1 | 6/2021 | Ramaswamy | | |
| 2024/0234531 | A1* | 7/2024 | Yeong | ................. | H10D 62/121 |

* cited by examiner

200

202 — Start with precursor structure in which a fin protrudes upward into a trench formed in an interlayer dielectric 204 — Deposit thin layer of amorphous silicon (a-Si) onto the precursor structure 206 — Deposit (e.g., PEALD) silicon nitride or silicon oxide spacer onto the a-Si 208 — Complete a VTFET

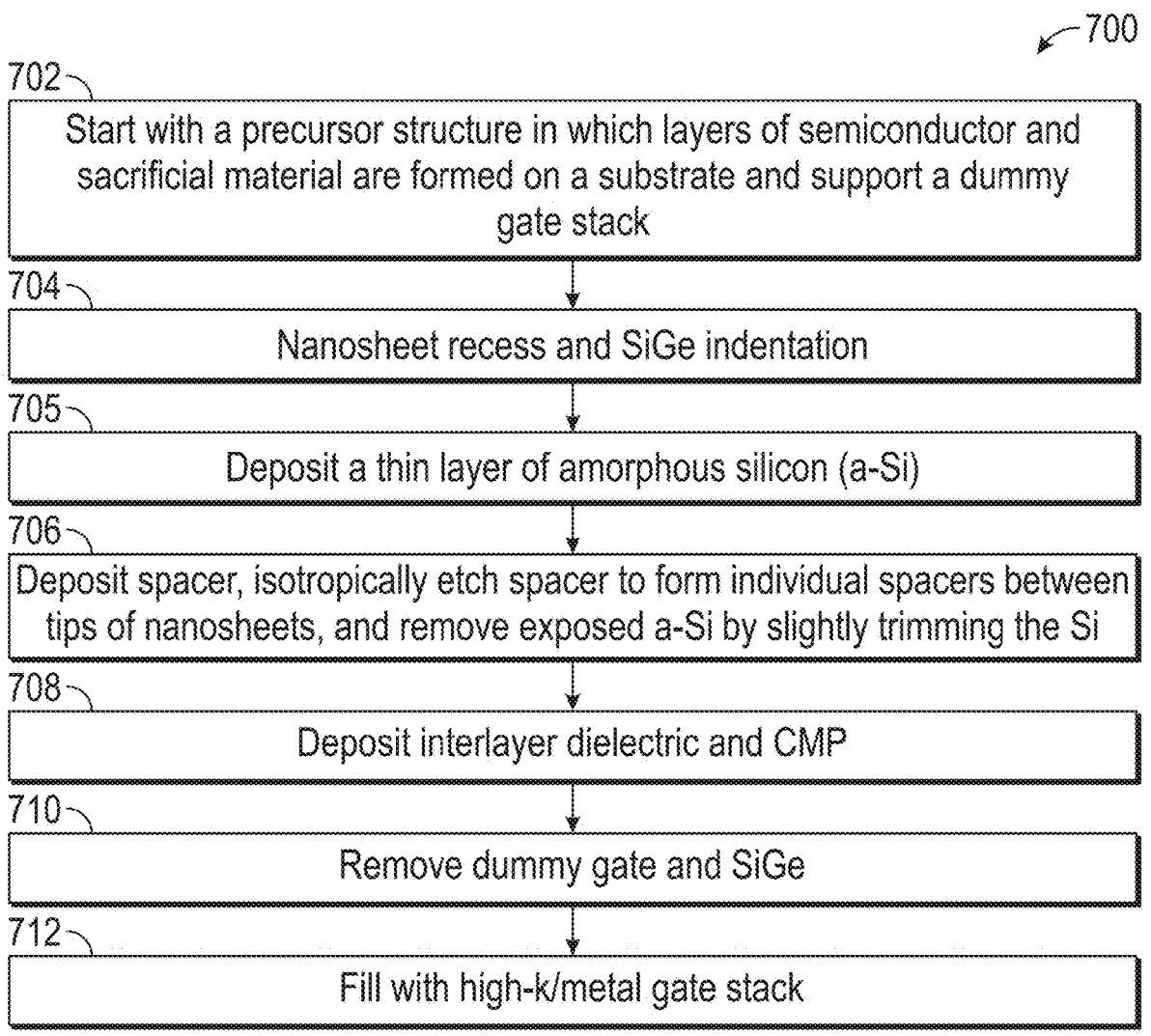

702

Start with a precursor structure in which layers of semiconductor and sacrificial material are formed on a substrate and support a dummy gate stack

704

Nanosheet recess and SiGe indentation

705

Deposit a thin layer of amorphous silicon (a-Si)

706

Deposit spacer, isotropically etch spacer to form individual spacers between tips of nanosheets, and remove exposed a-Si by slightly trimming the Si

708

Deposit interlayer dielectric and CMP

710

Remove dummy gate and SiGe

712

Fill with high-k/metal gate stack

*FIG. 7*

REDUCING CHANNEL STRUCTURE TIP DAMAGE DURING SPACER DEPOSITION

BACKGROUND

The present invention relates to the electrical, electronic, and computer arts, and more specifically, to semiconductor fabrication.

In making modern field effect transistors (FETs), generally, a semiconductor channel structure is formed (e.g., one or more fins or nanosheets), and then a spacer is formed around the channel structure. During deposition of the spacer material, e.g., a silicon nitride or other dielectric, damage typically occurs to the tips of the channel structure—due either to physical effects (e.g., plasma interactions during plasma-enhanced atomic layer deposition of the spacer), and/or chemical effects (e.g., oxidation of the channel structure surface with residual oxygen during deposition process). The damage causes narrowing of the channel structure tips, which in turn drives up the ON-resistance of the channel structure.

SUMMARY

Principles of the invention provide techniques for reducing channel structure tip damage during spacer deposition. In one aspect, an exemplary semiconductor structure includes a semiconductor channel structure that has a body and a tip; and a dielectric spacer adjacent to a portion of the channel structure near the tip. The tip is of substantially the same thickness as the body.

According to another aspect, a semiconductor structure includes a semiconductor channel structure that has a body and a tip; a dielectric spacer adjacent to a portion of the channel structure near the tip; and a liner between and directly contacting the spacer and the body of the channel structure. The liner is thicker away from the tip than it is near the tip.

According to another aspect, a method of making a semiconductor structure includes obtaining a precursor structure including a semiconductor channel structure with a body and a tip; depositing a liner around at least the tip of the semiconductor channel structure; and depositing a spacer onto the liner.

In view of the foregoing, techniques of the present invention can provide substantial beneficial technical effects. For example, one or more embodiments provide one or more of:

Forming a dielectric spacer around a semiconductor channel structure with no reduction of the channel structure tip thickness, or at least with reduced reduction as compared to the prior art.

Improved electrical performance of a field effect transistor that incorporates aspects of the invention in its fabrication process.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 7 depicts in a flowchart steps of a process for forming a nanosheet FET that comprises a novel channel and spacer structure, according to exemplary embodiments.

DETAILED DESCRIPTION

One problem addressed by one or more embodiments is that deposition of a silicon nitride spacer around the tips of silicon or silicon-germanium alloy fins or nanosheets ("channel structures" as defined herein), during fabrication of a transistor, tends to erode the tips so that they get thinner than the body of the fin or nanosheet. This thinning of the tips has a deleterious effect on electrical performance. In one or more embodiments of the invention, a thin layer of amorphous silicon armors the tips of the channel structures so that erosion of the tips during deposition of the spacer is reduced or eliminated. This advantageously improves electrical performance of the final transistor.

Figures 1, 2:
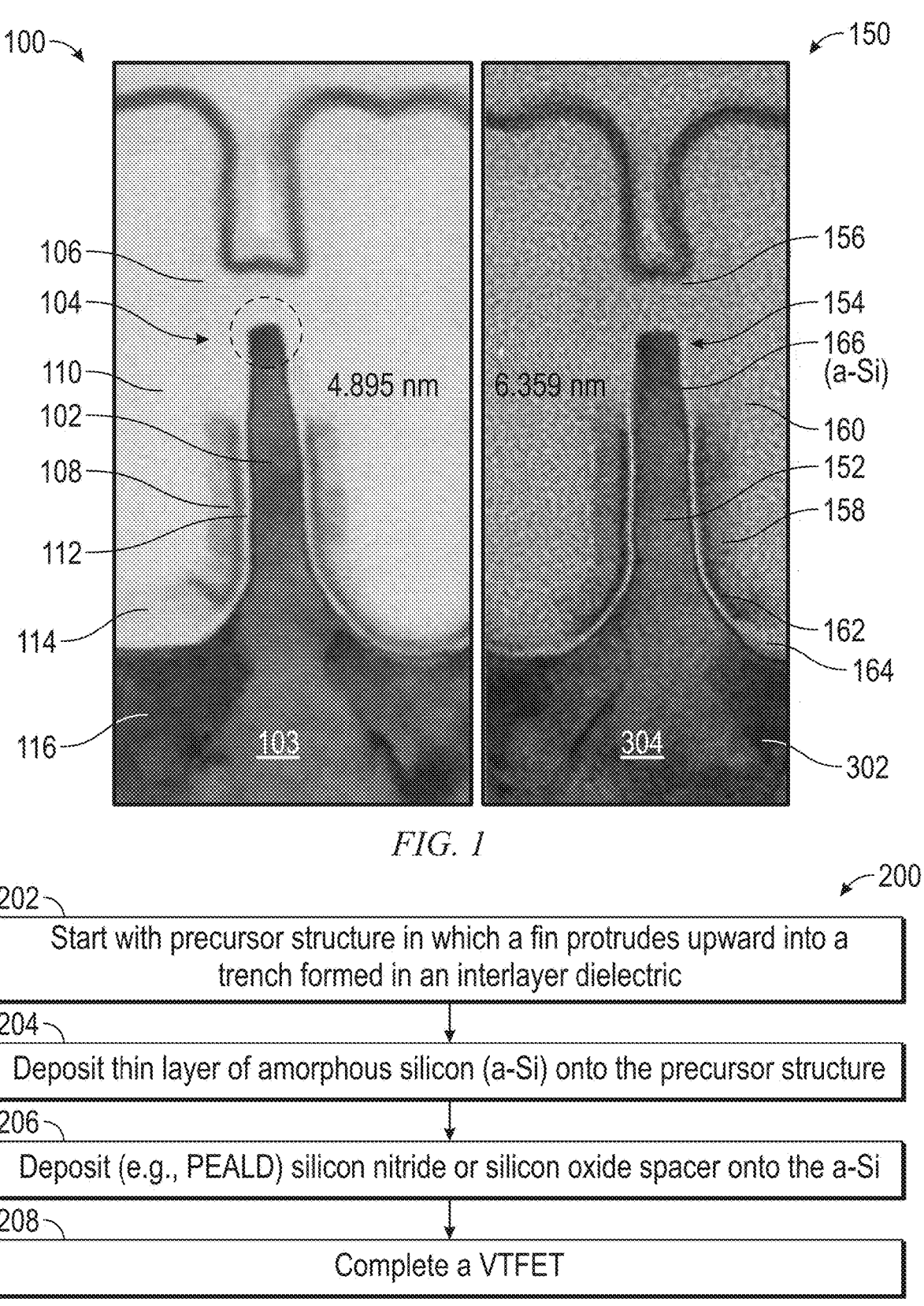
FIG. 1 depicts a photograph of a channel and spacer structure that is formed by conventional means, alongside a photograph of a novel channel and spacer structure that is formed according to exemplary embodiments.
FIG. 2 depicts in a flowchart steps of a process for forming a vertical transport field effect transistor (VTFET) that comprises the novel channel and spacer structure shown in FIG. 1, according to exemplary embodiments.

FIG. 1 depicts a photograph of a channel and spacer structure 100 that is formed by conventional means, alongside a photograph of a novel channel and spacer structure 150 that is formed according to exemplary embodiments.

In FIG. 1, the structure 100 includes a semiconductor (e.g., silicon) fin 102 that protrudes from a substrate 103. In one or more embodiments, the substrate is of the same composition as the fin. The fin 102 has a tip 104. Due to a depletion process inherent to deposition of a spacer 106 (in one or more embodiments, a spacer comprising silicon nitride), the tip 104 tends to be thinner than the fin 102. This thinning of the tip during deposition of the spacer increases resistance of the fin, thereby detracting from performance of the structure 100. Other components of the structure 100, which together form a precursor structure in the fabrication of a vertical transport field effect transistor (VTFET), include a work function material (WFM) 108 (as further discussed below), an interlayer dielectric (ILD) 110, a high-k dielectric liner 112 (e.g., hafnium oxide, other suitable materials are discussed below), a bottom spacer 114 (in one or more embodiments, a low-k dielectric), and a bottom source/drain 116.

Components of the structure 150, which are similar to those of the structure 100, are numbered with an increment of 50 from the numbering of structure 100. Thus, the structure 150 includes a fin 152 with a tip 154, and the fin 152 protrudes from a substrate 304. The structure 150 also includes a spacer 156, a WFM 158, an ILD 160, a liner 162, a bottom spacer 164, and a bottom source/drain 302. The structure 150 differs in two significant respects from the structure 100: the fin tip 154 is thicker than the fin tip 104, relative to the thicknesses of the fins 102 and 152; and the fin tip 154 is thicker because an amorphous silicon (a-Si) liner 166 has been deposited on the fin tip prior to deposition of the spacer 156, thereby mitigating the depletion process mentioned above.

Thus, an aspect of the invention is that depositing the a-Si liner 166 protects the fin tip 154 from depletion by later depositing the spacer 156. This advantageously results in improved electrical performance of a VTFET later formed from the structure 150, compared to the VTFET formed from the structure 100.

Figure 4:
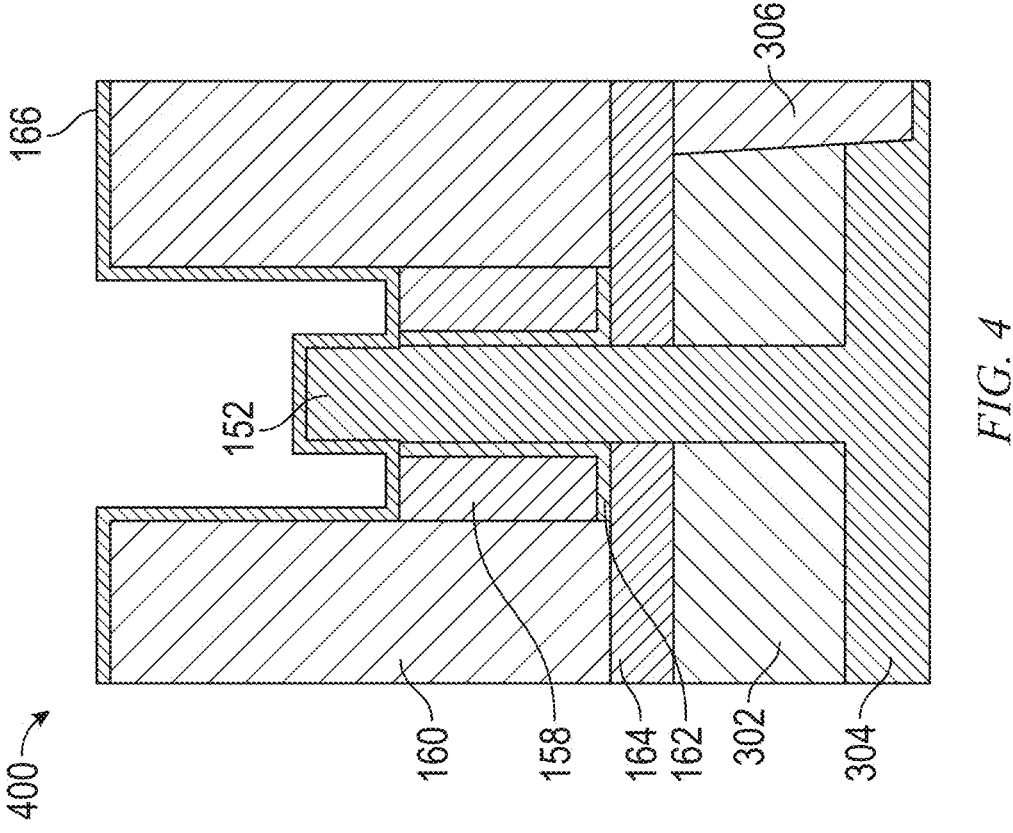
FIG. 3 and FIG. 4 depict in schematics precursor structures to the novel channel and spacer structure shown in FIG. 1.
Figure 3:
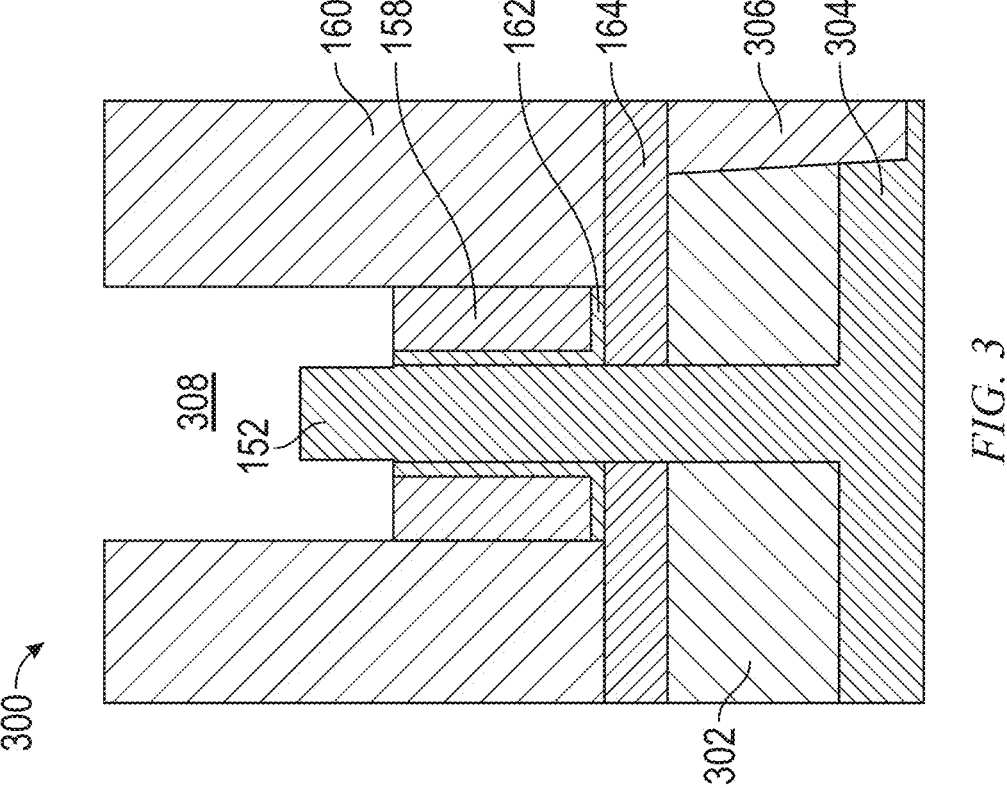
Figure 5:
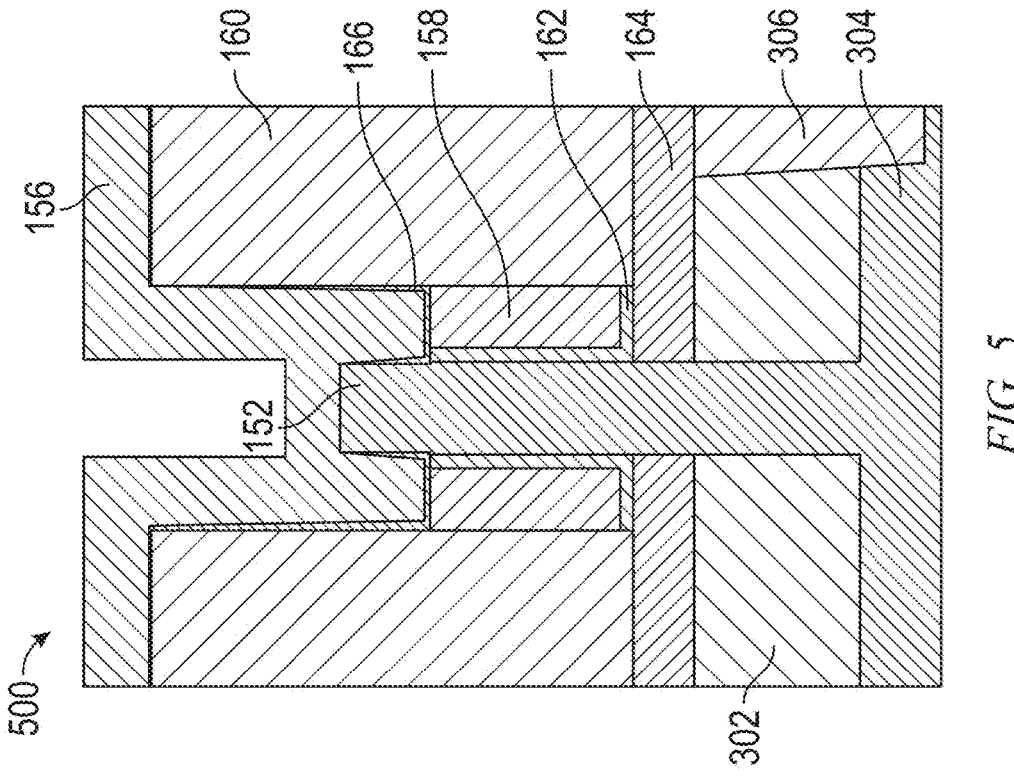
FIG. 5 depicts in a schematic the novel channel and spacer structure shown in FIG. 1.

FIG. 2 depicts in a flowchart steps of a process 200 for forming a vertical transport field effect transistor (VTFET) that comprises the novel channel and spacer structure 150 that is shown in FIG. 1, according to exemplary embodiments. FIG. 3 and FIG. 4 depict in schematics precursor structures to the novel channel and spacer structure shown in FIG. 1. FIG. 5 depicts in a schematic the novel channel and spacer structure shown in FIG. 1.

Referring to FIG. 2, at 202, start with the precursor structure 300 that is shown in FIG. 3. The precursor structure 300 includes fin 152, high-k dielectric liner 162, work function material 158, interlayer (low-k) dielectric 160, bottom spacer 164, bottom source/drain semiconductor 302, semiconductor substrate 304, and shallow trench isolation 306. The interlayer dielectric 160 defines a trench 308.

At 204, deposit the thin (in one or more embodiments, about 1 nm thickness) liner 166 of amorphous silicon (a-Si). FIG. 4 depicts the intermediate structure 400 that is formed at step 204.

At 206, deposit the spacer 156, e.g., a silicon nitride (SiN) spacer. FIG. 5 depicts the intermediate structure 500 that is formed at step 206, including the novel channel and spacer structure shown in FIG. 1. Note how the liner 166 thins around the tip of the fin 152, due to depletion of the liner by the spacer. It should be noted that Plasma Enhanced Atomic Layer Deposition (PEALD) can deposit conformal SiN for gap filling at low temperature, but it can generate plasma damage to the FIN tip unless the sacrificial layer of a-Si is employed as described herein.

Figure 6:
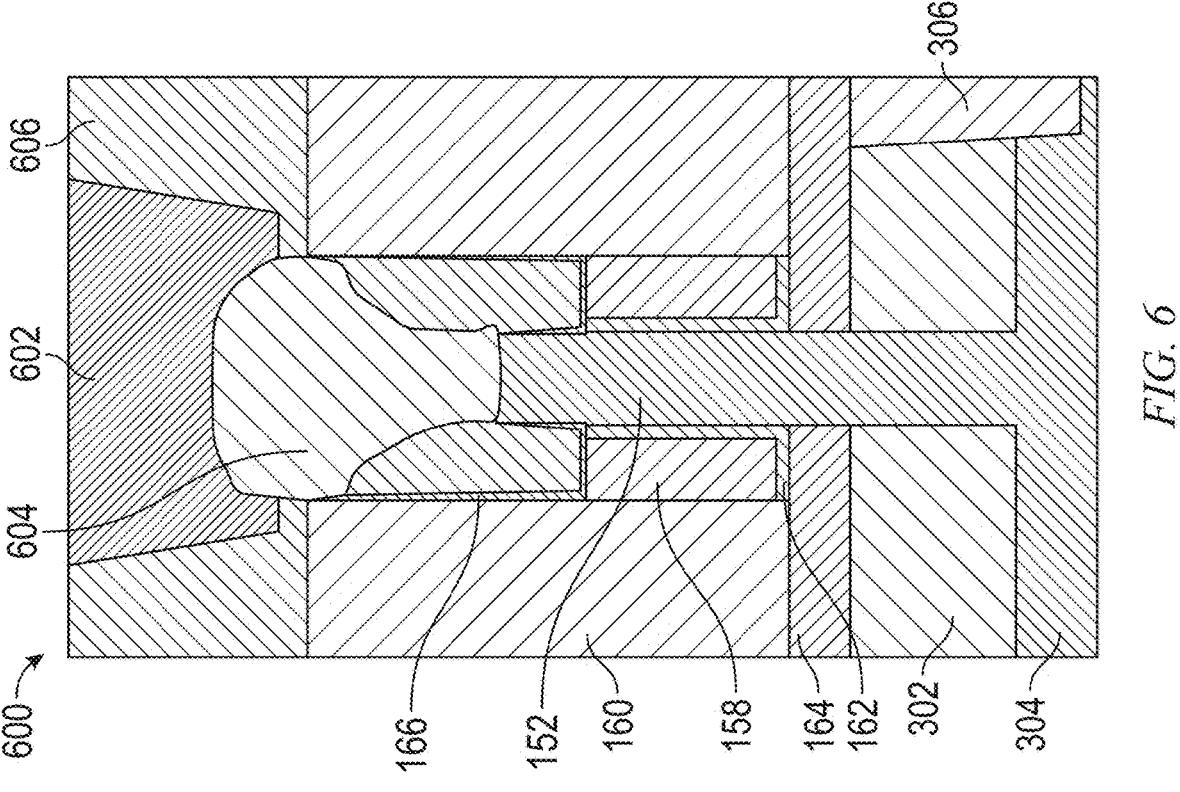
FIG. 6 depicts in a schematic the VTFET comprising the novel channel and spacer structure shown in FIG. 1 and FIG. 5, according to the process shown in FIG. 2.

At 208, and referring also to FIG. 6, complete a VTFET 600 that includes a top contact 602, a top source/drain semiconductor 604, and an additional dielectric layer 606. FIG. 6 depicts in a schematic the VTFET comprising the novel channel and spacer structure shown in FIG. 1 and FIG. 5, according to the process shown in FIG. 2.

FIG. 7 depicts in a flowchart steps of a process 700 for forming a nanosheet FET that comprises a novel channel and spacer structure, according to exemplary embodiments. FIG. 8 through FIG. 13 depict in schematics precursor structures to the nanosheet FET that is formed according to the process shown in FIG. 7.

Figure 8:
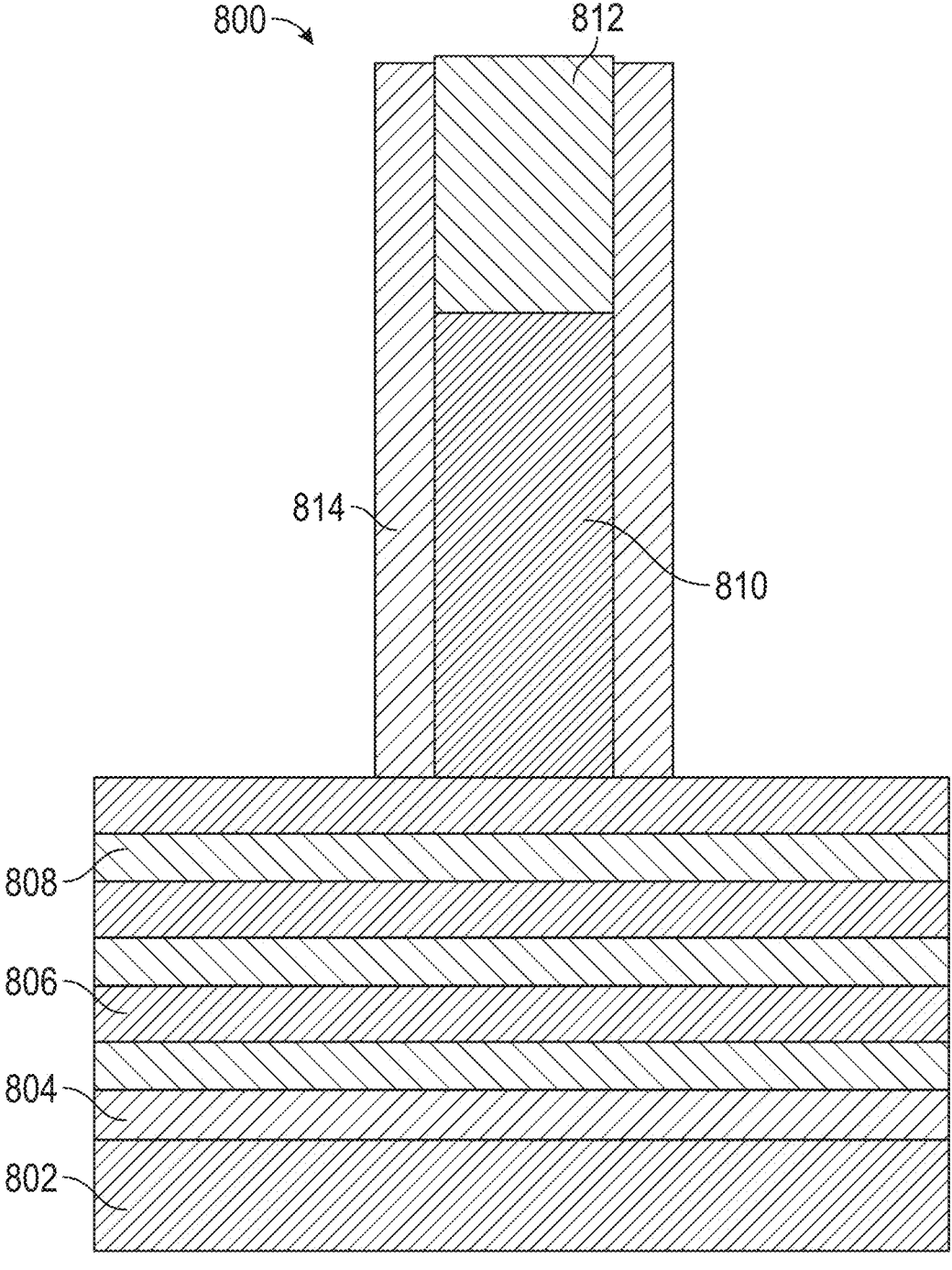
FIG. 8 through FIG. 13 depict in schematics precursor structures to the nanosheet FET that is formed according to the process shown in FIG. 7.

At 702, start with a precursor structure 800, as shown in FIG. 8, in which layers of semiconductor nanosheets 806 (e.g., silicon) and sacrificial material 808 (e.g., a silicon germanium alloy) are formed on a substrate 802 and support a dummy gate stack 810. A bottom dielectric isolator 804 separates the layers of nanosheets from the substrate. A hard mask 812 covers the top of the dummy gate stack, and spacers 814 cover the sides of the dummy gate stack.

Figures 9, 10:
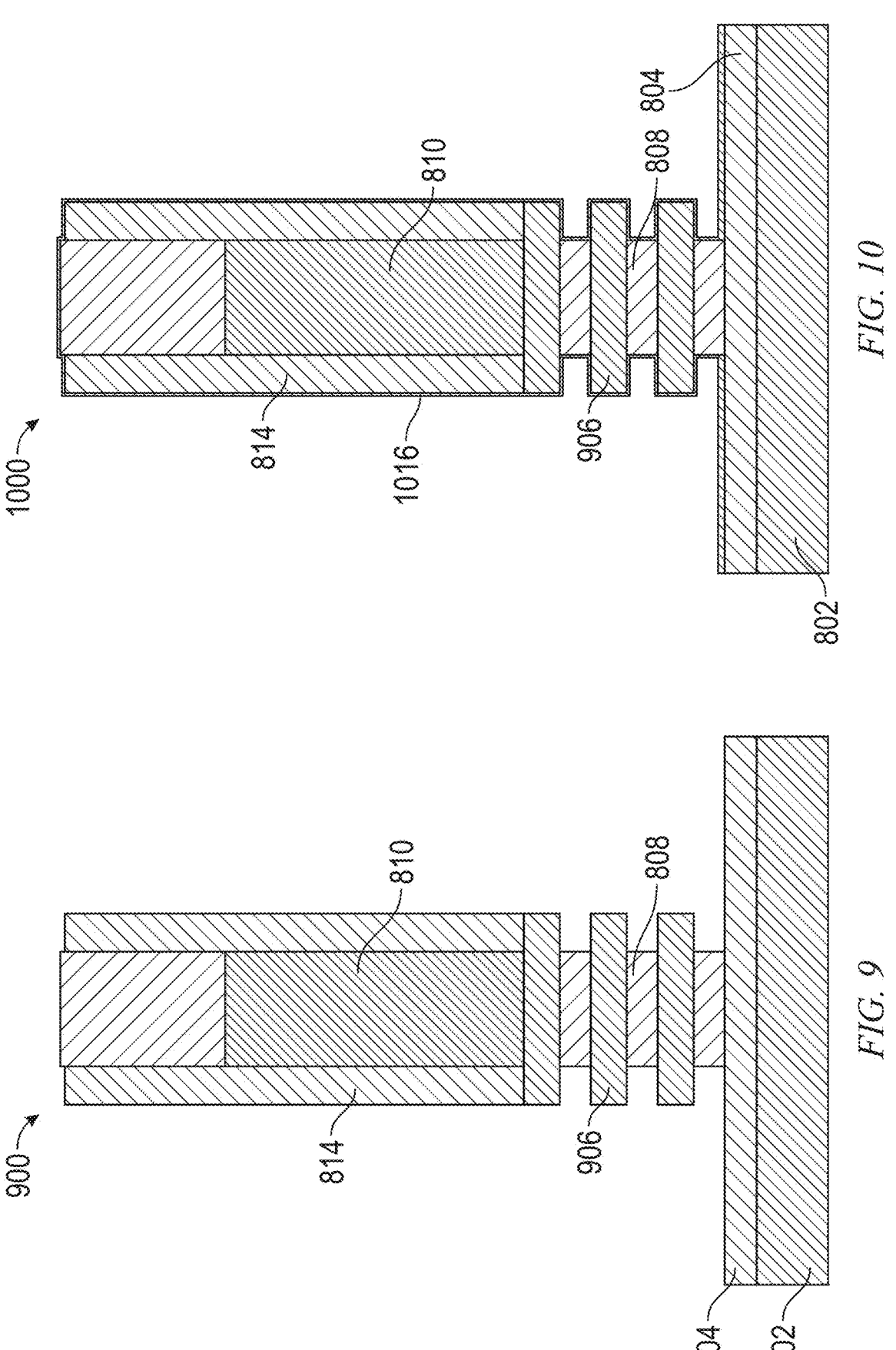

At 704, recess the nanosheets 806 and indent the sacrificial material 808 to form intermediate structure 900, as shown in FIG. 9. The indents of the sacrificial material define tips 906 on the nanosheets.

At 705, deposit a thin layer 1016 of amorphous silicon (a-Si), as shown in FIG. 10, to form an intermediate structure 1000.

Figure 11:
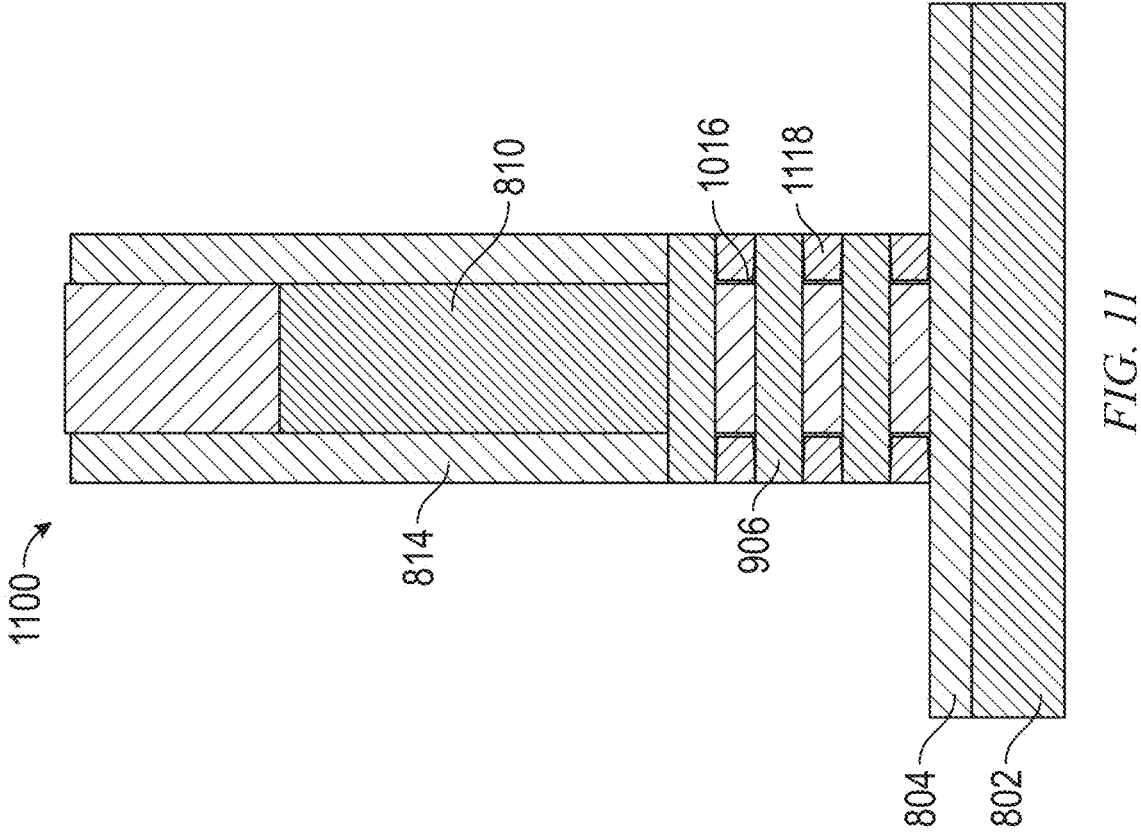

At 706, deposit a spacer 1118 (e.g., a silicon nitride spacer), isotropically etch the spacer to form individual spacers between tips 906 of the nanosheets, and remove the exposed a-Si by slightly trimming the Si, to form an intermediate structure 1100, as shown in FIG. 11. After deposition of the spacer, a remnant of the liner may be detectable at the tip by energy-dispersive X-ray spectroscopy (EDX).

Figure 12:
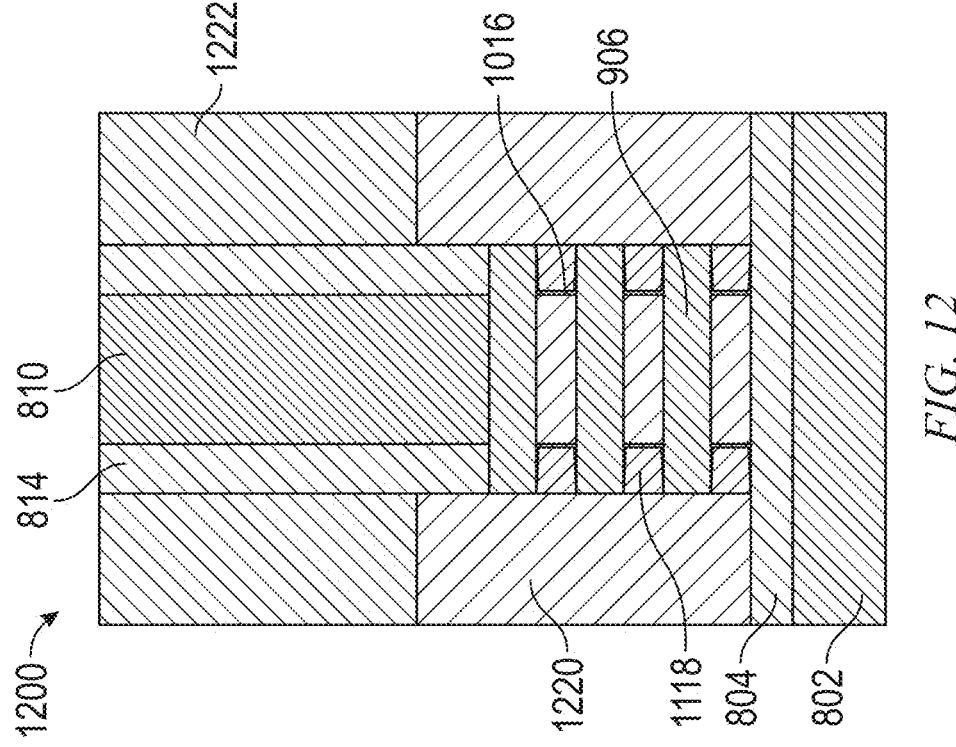

At 708, grow epitaxial semiconductor structures 1220 (source/drain regions), deposit an interlayer dielectric 1222, and planarize (e.g., by chemical-mechanical polishing) to remove the hard mask 812, thereby forming an intermediate structure 1200, as shown in FIG. 12.

Figure 14:
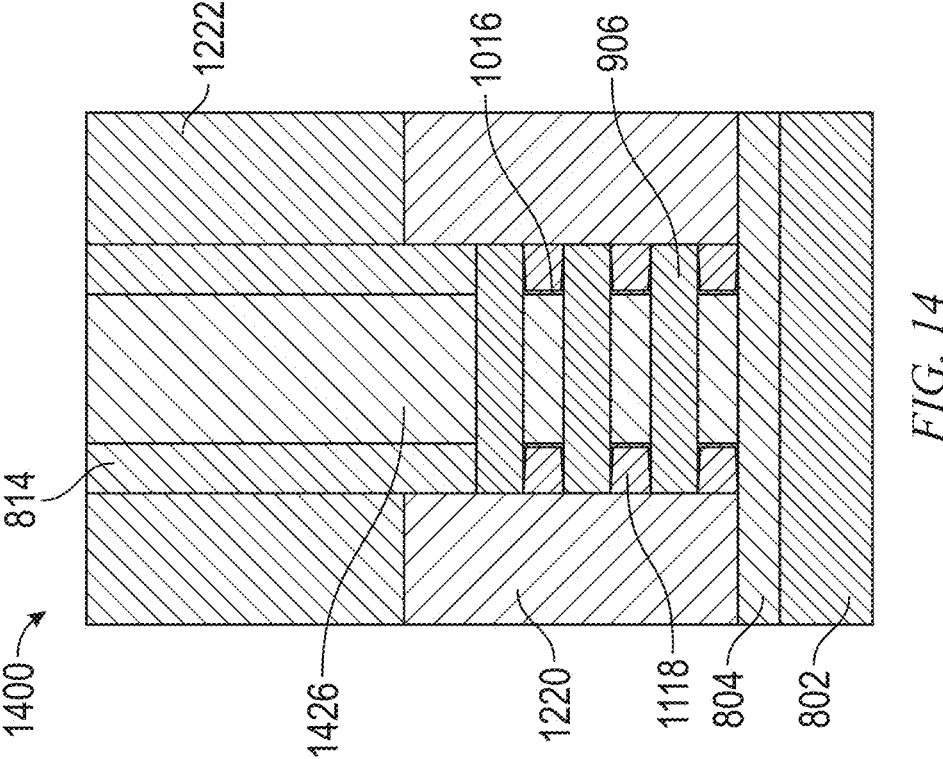
FIG. 14 depicts in a schematic a nanosheet FET comprising the novel channel and spacer structure that is formed according to the process shown in FIG. 7.
Figure 13:
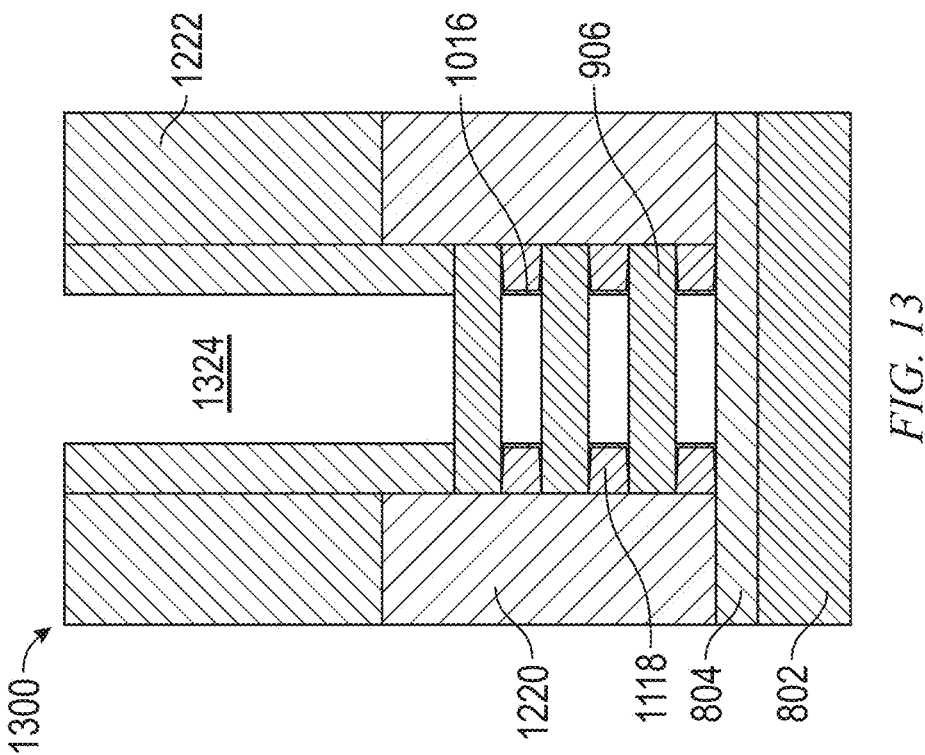

At 710, remove the dummy gate 810 and the sacrificial material 808 to form an intermediate structure 1300 with a void 1324 (as shown in FIG. 13), then, at 712, fill with a high-k/metal gate stack 1426 (as shown in FIG. 14).

FIG. 14 depicts in a schematic a nanosheet FET 1400, which comprises the novel channel and spacer structure 906, 1016, 1118 that is formed according to the process 700 shown in FIG. 7.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Various materials herein are referred to as being epitaxially grown. "Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Gate stacks in both nFET and pFET structures (in embodiments having both types of regions) include work function material (WFM) layers. Non-limiting examples of suitable work function (gate) metals include p-type work function materials and n-type work function materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function material(s) may be deposited by a suitable deposition process, for example, ALD, CVD, PECVD, PVD, plating, and thermal or e-beam evaporation. Pinch-off of work function material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function materials such as titanium nitride (TiN).

Given the discussion thus far, it will be appreciated that, in general terms, an exemplary semiconductor structure 150, according to an aspect of the invention, includes a semiconductor channel structure that has a body 152 and a tip 154; and a dielectric spacer 156 adjacent to a portion of the channel structure near the tip. The tip is of substantially the same thickness as the body. In one or more embodiments, the tip of the channel structure is no less than 70% the thickness of the body. In one or more embodiments, the body of the channel structure is no more than 8 nm thick and the tip of the channel structure is no less than 6 nm thick. In one or more embodiments, the channel structure includes an alloy of silicon and germanium. In one or more embodiments, the spacer includes silicon nitride and the liner includes amorphous silicon.

As used herein, a "channel structure" refers to the physical region of the device where the channel forms when the gate is energized to turn the device on—for example, the fin in a FINFET or the nanosheets in a nanosheet FET.

According to another aspect, a semiconductor structure 1400 includes a semiconductor channel structure 906 that has a body and a tip; a dielectric spacer 1118 adjacent to a portion of the channel structure near the tip; and a liner 1016 between and directly contacting the spacer and the body of the channel structure. The liner is thicker away from the tip than it is near the tip. In one or more embodiments, the channel structure includes an alloy of silicon and germanium. In one or more embodiments, the spacer includes silicon nitride. In one or more embodiments, the liner includes amorphous silicon. In one or more embodiments, the liner is no more than 1 nm thick at its thickest part. In one or more embodiments, the tip is no less than 70% the thickness of the body. In one or more embodiments, the body of the channel structure is no more than 8 nm thick and the tip of the channel structure is no less than 6 nm thick.

According to another aspect, a method 200 of making a semiconductor structure includes, at 202, obtaining a precursor structure 300 including a semiconductor channel structure 152 with a body and a tip; at 204, depositing a liner 166 around at least the tip of the semiconductor channel structure; and, at 206, depositing a spacer 156 onto the liner, In one or more embodiments, the spacer absorbs at least a portion of the liner near the end of the tip, and thereby absorbs less of the tip than would be absorbed without the liner being present. In one or more embodiments, the channel structure includes an alloy of silicon and germanium. In one or more embodiments, the spacer includes silicon nitride. In one or more embodiments, the liner includes amorphous silicon. In one or more embodiments, before deposition of the spacer, the tip is of the same thickness as the body. In one or more embodiments, after deposition of the spacer the tip is no less than 70% the thickness of the body. In one or more embodiments, before deposition of the spacer the body of the channel structure is no more than 8 nm thick and after deposition of the spacer the tip of the channel structure is no less than 6 nm thick. In one or more embodiments, before deposition of the spacer the liner is no more than 1 nm thick. In one or more embodiments, after deposition of the spacer a remnant of the liner is detectable at the tip by energy-dispersive X-ray spectroscopy (EDX).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. It should be understood that "adjacent" does not mean "directly contacting" and that there can be an intervening layer or feature between "adjacent" structures, features, or layers.

What is claimed is:

1. A semiconductor structure comprising:
   a semiconductor channel structure that has a body and a tip;
   a dielectric spacer adjacent to the tip; and
   an amorphous silicon liner positioned between and directly contacting the dielectric spacer and the body of the semiconductor channel structure,
   wherein the tip of the semiconductor channel structure has a same thickness as, or is thinner than, the body of the semiconductor channel structure, and wherein the tip of the semiconductor channel structure is no less than 70% a thickness of the body of the semiconductor channel structure.

2. The structure of claim 1, wherein the body of the semiconductor channel structure is no more than 8 nm thick and the tip of the semiconductor channel structure is no less than 6 nm thick.

3. The structure of claim 1, wherein the semiconductor channel structure comprises silicon.

4. The structure of claim 3, wherein the semiconductor channel structure comprises an alloy of silicon and germanium.

5. The semiconductor structure of claim 1, wherein the dielectric spacer comprises silicon nitride.

6. The structure of claim 1, wherein the tip of the semiconductor channel structure is thinner than the body of the semiconductor channel structure.

7. A semiconductor structure comprising:
   a semiconductor channel structure that has a body and a tip, wherein the tip of the semiconductor channel structure has a same thickness as, or is thinner than, the body of the semiconductor channel structure;
   a dielectric spacer adjacent to the tip of the semiconductor channel structure; and
   an amorphous silicon liner between and directly contacting the dielectric spacer and the body of the semiconductor channel structure, wherein the amorphous silicon liner is thicker away from the tip of the semiconductor channel structure than near the tip of the semiconductor channel structure.

8. The structure of claim 7, wherein the semiconductor channel structure comprises an alloy of silicon and germanium.

9. The structure of claim 8, wherein the dielectric spacer comprises silicon nitride.

10. The structure of claim 7, wherein the liner is no more than 1 nm thick at its thickest part.

11. The structure of claim 10, wherein a remnant of the liner is detectable at the tip of the semiconductor channel structure by energy-dispersive X-ray spectroscopy (EDX).

12. The structure of claim 7, wherein the tip of the semiconductor channel structure is no less than 70% a thickness of the body of the semiconductor channel structure.

13. The structure of claim 7, wherein the body of the semiconductor channel structure is no more than 8 nm thick and the tip of the semiconductor channel structure is no less than 6 nm thick.

14. The structure of claim 7, wherein the tip of the semiconductor channel structure is thinner than the body of the semiconductor channel structure.

* * * * *